(12) United States Patent
Herner

(10) Patent No.: US 7,682,920 B2
(45) Date of Patent: Mar. 23, 2010

(54) METHOD FOR MAKING A P-I-N DIODE CRYSTALLIZED ADJACENT TO A SILICIDE IN SERIES WITH A DIELECTRIC ANTIFUSE

(75) Inventor: S. Brad Herner, San Jose, CA (US)

(73) Assignee: Sandisk 3D LLC, Milpitas, CA (US)

( * ) Notice: Subject to any disclaimer, the term of this patent is extended or adjusted under 35 U.S.C. 154(b) by 0 days.

(21) Appl. No.: 11/560,283

(22) Filed: Nov. 15, 2006

(65) Prior Publication Data

US 2007/0087508 A1   Apr. 19, 2007

Related U.S. Application Data

(63) Continuation-in-part of application No. 10/954,510, filed on Sep. 29, 2004, now Pat. No. 7,176,064, which is a continuation-in-part of application No. 10/728,230, filed on Dec. 3, 2003, now Pat. No. 6,946,719.

(51) Int. Cl.
*H01L 21/331* (2006.01)
(52) U.S. Cl. ............................... 438/378; 257/E21.37
(58) Field of Classification Search ............... 438/257, 438/131, 467, 600, 957, 378; 257/E23.147, 257/E27.073, E21.37
See application file for complete search history.

(56) References Cited

U.S. PATENT DOCUMENTS

| | | | |
|---|---|---|---|
| 5,521,423 A * | 5/1996 | Shinriki et al. | ............... 257/530 |
| 5,693,556 A | 12/1997 | Cleeves | |
| 5,962,911 A | 10/1999 | Manley | |
| 6,034,882 A | 3/2000 | Johnson et al. | |
| 6,100,120 A | 8/2000 | Yu | |
| 6,420,215 B1 | 7/2002 | Knall et al. | |
| 6,486,065 B2 | 11/2002 | Vyvoda et al. | |
| 6,515,888 B2 | 2/2003 | Johnson et al. | |
| 6,525,953 B1 | 2/2003 | Johnson | |
| 6,534,403 B2 | 3/2003 | Cleeves | |
| 6,541,312 B2 | 4/2003 | Cleeves et al. | |
| 6,661,691 B2 | 12/2003 | Fricke et al. | |
| 6,686,646 B2 | 2/2004 | Lee | |
| 6,777,773 B2 | 8/2004 | Knall | |
| 6,853,049 B2 | 2/2005 | Herner | |

(Continued)

OTHER PUBLICATIONS

Hatalis, et al., "Large Grain Polycrystalline Silicon by Low-Temperature Annealing of Low-Pressure Chemical Vapor Deposited Amorphous Silicon Films," J. Appl. Phys. 63(7), (Apr. 1, 1988), 2260-2266.

(Continued)

*Primary Examiner*—Thao Le
(74) *Attorney, Agent, or Firm*—Dugan & Dugan, PC

(57) ABSTRACT

A method is described for forming a nonvolatile one-time-programmable memory cell having reduced programming voltage. A contiguous p-i-n diode is paired with a dielectric rupture antifuse formed of a high-dielectric-constant material, having a dielectric constant greater than about 8. In preferred embodiments, the high-dielectric-constant material is formed by atomic layer deposition. The diode is preferably formed of deposited low-defect semiconductor material, crystallized in contact with a silicide. A monolithic three dimensional memory array of such cells can be formed in stacked memory levels above the wafer substrate.

15 Claims, 5 Drawing Sheets

U.S. PATENT DOCUMENTS

| | | | |
|---|---|---|---|
| 6,946,719 | B2 | 9/2005 | Petti et al. |
| 6,952,043 | B2 | 10/2005 | Vyvoda et al. |
| 6,956,278 | B2 | 10/2005 | Herner |
| 7,176,064 | B2 | 2/2007 | Herner |
| 7,224,013 | B2 * | 5/2007 | Herner et al. ............... 257/296 |
| 7,265,000 | B2 * | 9/2007 | Subramanian et al. ...... 438/131 |
| 7,314,815 | B2 | 1/2008 | Ho et al. |
| 7,319,053 | B2 * | 1/2008 | Subramanian et al. ...... 438/131 |
| 7,405,465 | B2 * | 7/2008 | Herner ........................ 257/616 |
| 2003/0003632 | A1 | 1/2003 | Cleeves et al. |
| 2003/0062594 | A1 | 4/2003 | Chen |
| 2004/0016991 | A1 | 1/2004 | Johnson et al. |
| 2004/0232509 | A1 | 11/2004 | Vyvoda |
| 2005/0052915 | A1 | 3/2005 | Herner et al. |
| 2005/0121742 | A1 * | 6/2005 | Petti et al. ................... 257/530 |
| 2006/0067117 | A1 | 3/2006 | Petti |
| 2006/0250836 | A1 | 11/2006 | Herner et al. |
| 2006/0250837 | A1 | 11/2006 | Herner et al. |
| 2007/0002603 | A1 | 1/2007 | Cleeves |
| 2007/0069217 | A1 | 3/2007 | Herner |
| 2007/0105284 | A1 | 5/2007 | Herner |
| 2008/0025118 | A1 * | 1/2008 | Scheuerlein ................ 365/201 |

OTHER PUBLICATIONS

Holloway, et al., "Amorphous Ti-Si Alloy Formed by Interdiffusion of Amorphous Si and Crystalline Ti Multilayers," J. Appl. Phys. 61(4), (Feb. 15, 1987), 1359-1364.

Kim, et al., "Oxidation Behavior of a Patterned TiSi2/Polysilicon Stack," J. Vac. Sci. Technol. B 19(2), (Mar./Apr. 2001), 366-371.

Tang, et al., "Twinning in TiSi2-Island Catalyzed Si Nanowires Grown by Gas-Source Molecular-Beam Epitaxy," Applied Physics Letters, vol. 81, No. 13, (Sep. 23, 2002), 2451-2453.

Tung, "Oxide Mediated Epitaxy of CoSi2 on Silicon," Appl. Phys. Lett. 68 (24), (Jun. 10, 1996), 3461-3463.

McPherson, et al., "Proposed Universal Relationship Between Dielectric Breakdown and Dielectric Constant," Proceedings of 2003 IEDM, pp. 633-636.

Herner, et al., "Effect of Ohmic Contacts on Polysilicon Memory Effect," Proceedings of Materials Research Society, vol. 864, E5.6.1 (2005).

U.S. Appl. No. 10/326,470 (MA-086) filed Dec. 19, 2002, Herner et al.

International Search Report and Written Opinion of International Application No. PCT/US2007/023855 mailed May 7, 2008.

Ex parte Quayle Office Action of U.S. Appl. No. 11/613,151 mailed Mar. 6, 2008.

Notice of Allowance of U.S. Application No. 11/613,151 mailed Sep. 24, 2008.

Hamdy, Esmat et al., "Dielectric Based Antifuse for Logic and Memory Ics", IEDM 88, (1988), 786-789.

Herner, S. B. et al. "Polycrystalline Silicon/CoSi2 Schottky Diode with Integrated SiO2 Antifuse: A Nonvolatile Memory Cell", Applied Physics Letter, vol. 82, No. 23, Jun. 9, 2003, 4163-4165.

Konakova, R.V. et al., "Ohmic Contacts for Microwave Diodes", Proc. 22nd International Conference on Microelectronics (MIEL 2000), vol. 2, NIS, Serbia, May 14-17, 2000, (Jan. 1999), 477-480.

Shih, Chih-Ching et al., "Characterization and Modeling of a Highly Reliable Metal-to-Metal Antifuse for High-Performance and High-Density Field-Programmable Gate Arrays", 1977 IEEE, (Sep. 1997), 25-33.

Wang, Shoue-Jen et al., "High-Perfomance Metal/Silicide Antifuse", IEEE Electron Device Letter, vol. 13, No. 9, Sep. 1992, 471-472.

Chiang, Steve et al., "Antifuse Structure Comparison for Field Programmable Gate Arrays", IEDM 92-611, (Apr. 1992), 24.6.1-24.6.4.

Office Action of U.S. Appl. No. 11/613,151 mailed Feb. 13, 2009.

Notice of Allowance of U.S. Appl. No. 11/613,151 mailed Jul. 1, 2009.

May 6, 2009 Reply to Feb. 13, 2009 Office Action of U.S. Appl. No. 11/613,151.

Office Action of U.S. Appl. No. 11/560,289 mailed Sep. 18, 2009.

Office Action of U.S. Appl. No. 11/613,151 mailed Sep. 18, 2009.

International Preliminary Report on Patentability of International Application No. PCT/US2007/023855 dated May 28, 2009.

Aug. 4, 2009 Preliminary Amendment of European Patent Application No. 07 840 040.5.

Jan. 30, 2009 Preliminary Amendment of U.S. Appl. No. 11/560,289.

Sep. 8, 2008 Reply to Mar. 6, 2008 Ex Parte Quayle Office Action of U.S. Appl. No. 11/613,151.

Dec. 17, 2009 Reply to Office Action of related U.S. Appl. No. 11/560,289 mailed Sep. 18, 2009.

Dec. 10, 2009 Reply to Sep. 18, 2009 Office Action of related U.S. Appl. No. 11/613,151.

* cited by examiner

Embodiment of 6,952,030

US 7,682,920 B2

METHOD FOR MAKING A P-I-N DIODE CRYSTALLIZED ADJACENT TO A SILICIDE IN SERIES WITH A DIELECTRIC ANTIFUSE

RELATED APPLICATIONS

This application is a continuation in part of Herner, U.S. patent application Ser. No. 10/954,510, "Memory Cell Comprising a Semiconductor Junction Diode Crystallized Adjacent to a Silicide," filed Sep. 29, 2004, and issued Feb. 13, 2007, as U.S. Pat. No. 7,176,064, hereinafter the '510 application, which is a continuation in part of Ser. No. 10/728,230, filed Dec. 3, 2003 Petti et al., now U.S. Pat. No. 6,946,719, "Semiconductor Device Including Junction Diode Contacting Contact-Antifuse Unit Comprising Silicide," both owned by the assignee of the present invention and both hereby incorporated by reference. This application is related to Herner, U.S. patent application Ser. No. 11/560,289, "P-I-N Diode Crystallized Adjacent to a Silicide in Series with a Dielectric Antifuse," filed on even date herewith and hereby incorporated by reference in its entirety.

BACKGROUND OF THE INVENTION

The invention relates to a nonvolatile memory cell including a diode and a dielectric rupture antifuse formed electrically in series between conductors. In general, it is advantageous to minimize the voltage required to program such a memory cell.

SUMMARY OF THE PREFERRED EMBODIMENTS

The present invention is defined by the following claims, and nothing in this section should be taken as a limitation on those claims. In general, the invention is directed to a nonvolatile memory cell including a dielectric rupture antifuse formed of high-dielectric constant-antifuse material and a semiconductor diode formed of low-resistivity semiconductor material.

A first aspect of the invention provides for a method for forming and programming a nonvolatile memory cell, the method comprising: forming a contiguous p-i-n diode, the contiguous p-i-n diode comprising deposited semiconductor material; forming a layer of a silicide, silicide-germanide, or germanide in contact with the deposited semiconductor material; crystallizing the deposited semiconductor material in contact with the layer of silicide, silicide-germanide, or germanide; forming a layer of a dielectric material having a dielectric constant greater than 8; and subjecting a portion of the layer of dielectric material to dielectric breakdown, wherein the memory cell comprises the contiguous p-i-n diode and the layer of dielectric material.

Another aspect of the invention provides for a first memory level comprising: a plurality of first substantially parallel, substantially coplanar conductors formed above a substrate; a plurality of second substantially parallel, substantially coplanar conductors formed above the first conductors; a plurality of vertically oriented contiguous p-i-n diodes comprising semiconductor material, the semiconductor material crystallized adjacent to a silicide, silicide-germanide, or germanide layer; a plurality of dielectric rupture antifuses formed of a dielectric material having a dielectric constant greater than about 8, wherein each of the contiguous p-i-n diodes is disposed between one of the first conductors and one of the second conductors, and wherein each of the dielectric rupture antifuses is disposed between one of the first conductors and one of the contiguous p-i-n diodes or between one of the second conductors and one of the contiguous p-i-n diodes; and a plurality of memory cells, each memory cell comprising one of the contiguous p-i-n diodes and one of the dielectric rupture antifuses.

A preferred embodiment of the invention provides for a monolithic three dimensional memory array formed above a substrate comprising: a) a first memory level monolithically formed above the substrate, the first memory level comprising: i) a plurality of first substantially parallel, substantially coplanar conductors extending in a first direction; ii) a plurality of second substantially parallel, substantially coplanar conductor extending in a second direction different from the first direction, the second conductors above the first conductors; iii) a plurality of vertically oriented contiguous p-i-n diodes formed of deposited semiconductor material, the semiconductor material crystallized adjacent to a silicide, silicide-germanide, or germanide layer, each diode vertically disposed between one of the first conductors and one of the second conductors; iv) a plurality of dielectric rupture antifuses formed of a dielectric material having a dielectric constant greater than 8; and v) a plurality of memory cells, each memory cell comprising one of the diodes and one of the dielectric rupture antifuses arranged in series; and b) a second memory level monolithically formed above the first memory level.

Another aspect of the invention provides for a device comprising: a contiguous p-i-n diode comprising semiconductor material; a silicide or silicide-germanide layer in contact with the semiconductor material of the contiguous p-i-n diode; and a dielectric rupture antifuse comprising a dielectric material, the dielectric material having a dielectric constant of 8 or greater, wherein the contiguous p-i-n diode and the dielectric rupture antifuse are arranged electrically in series between a first conductor and a second conductor.

Still another aspect of the invention provides for a method for forming and programming a nonvolatile memory cell, the method comprising: forming a contiguous p-i-n diode, the contiguous p-i-n diode comprising deposited semiconductor material; forming a layer of a silicide, silicide-germanide, or germanide in contact with the deposited semiconductor material; crystallizing the deposited semiconductor material in contact with the layer of silicide, silicide-germanide, or germanide; forming a layer of a dielectric material having a dielectric constant greater than 8; and subjecting a portion of the layer of dielectric material to dielectric breakdown, wherein the memory cell comprises the contiguous p-i-n diode and the layer of dielectric material.

An additional aspect of the invention provides for a method for monolithically forming a first memory level above a substrate, the method comprising: forming a plurality of first substantially parallel, substantially coplanar conductors above the substrate, the first conductors extending in a first direction; forming a plurality of vertically oriented contiguous p-i-n diodes above the first conductors, the contiguous p-i-n diode comprising semiconductor material crystallized in contact with a silicide, silicide-germanide, or germanide layer; forming a plurality of second substantially parallel, substantially coplanar conductors, the second conductors above the contiguous p-i-n diodes, the second conductors extending in a second direction different from the first direction, each contiguous p-i-n diode vertically disposed between one of the first conductors and one of the second conductors; and forming a plurality of dielectric rupture antifuses, each dielectric rupture antifuse disposed between one of the contiguous p-i-n diodes and one of the first conductors or between one of the contiguous p-i-n diodes and one of the second conductors, wherein the dielectric rupture antifuses comprise dielectric material, the dielectric material having a dielectric constant greater than about 8.

A preferred embodiment of the invention provides for a method for forming a monolithic three dimensional memory array above a substrate, the method comprising: a) monolithically forming a first memory level above the substrate, the first memory level formed by a method comprising: i) forming a plurality of first substantially parallel, substantially coplanar conductors extending in a first direction; ii) forming a plurality of second substantially parallel, substantially coplanar conductor extending in a second direction different from the first direction, the second conductors above the first conductors; iii) forming a plurality of vertically oriented contiguous p-i-n diodes formed of deposited semiconductor material, the deposited semiconductor material crystallized in contact with a silicide, silicide-germanide, or germanide layer, each diode vertically disposed between one of the first conductors and one of the second conductors; iv) forming a plurality of dielectric rupture antifuses formed of a dielectric material having a dielectric constant greater than 8; and v) forming a plurality of memory cells, each memory cell comprising one of the diodes and one of the dielectric rupture antifuses arranged in series; and b) monolithically forming a second memory level above the first memory level.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Figure 1:
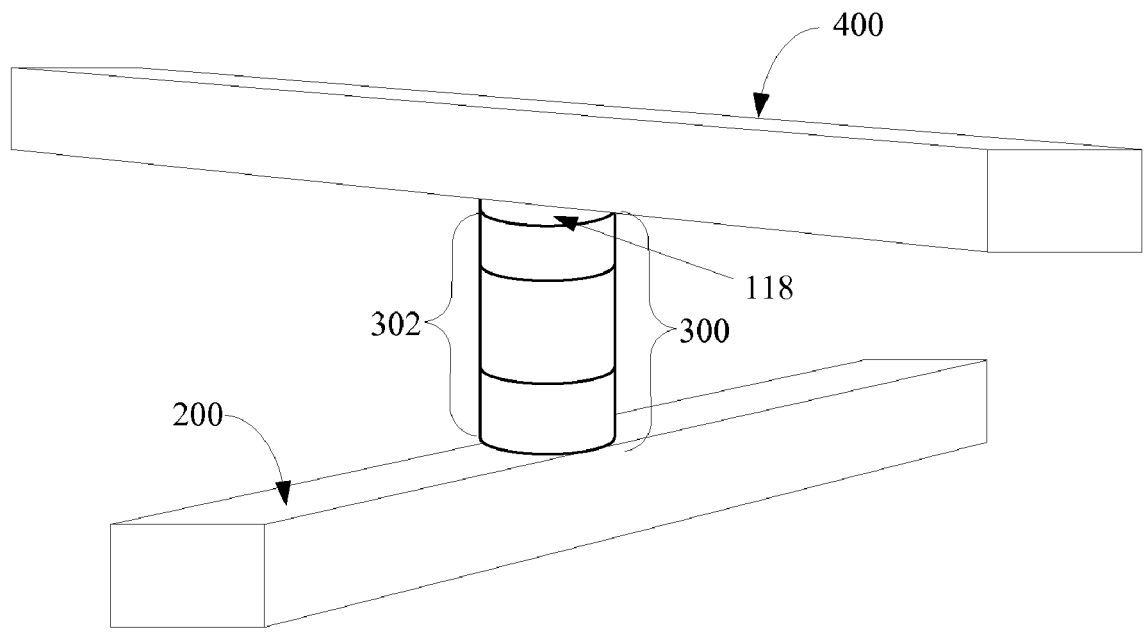
FIG. 1 is a perspective view of the memory cell of U.S. Pat. No. 6,952,030.

FIG. 1 shows an embodiment of a memory cell described in Herner et al., U.S. Pat. No. 6,952,030, "High-density three-dimensional memory cell," hereinafter the '030 patent. In this nonvolatile memory cell, pillar 300, comprising a diode 302 and a dielectric rupture antifuse 118, are arranged electrically in series between top conductor 400 and bottom conductor 200. In the initial state of this memory cell, when a read voltage is applied between top conductor 400 and bottom conductor 200 very little current flows between them. Application of a relatively large programming current permanently alters the memory cell of FIG. 1 so that, after programming, much more current flows at the same read voltage. This difference in current under the same applied read voltage allows a programmed cell to be distinguished from an unprogrammed cell; for example for a data "0" to be distinguished from a data "1".

As described in detail in Herner et al., U.S. patent application Ser. No. 10/955,549, "Nonvolatile Memory Cell Without a Dielectric Antifuse Having High-and Low-Impedance States," filed Sep. 29, 2004 and hereinafter the '549 application; and in Herner et al., U.S. patent application Ser. No. 11/148,530, "Nonvolatile Memory Cell Operating by Increasing Order in Polycrystalline Semiconductor Material," filed Jun. 8, 2005, and hereinafter the '530 application, both owned by the assignee of the present invention and hereby incorporated by reference, diode 302 is formed of semiconductor material which, in the initial, unprogrammed device, is in a relatively high-resistivity state. Application of a programming voltage across diode 302 changes the semiconductor material from a high-resistivity state to a lower-resistivity state.

In a cell like that shown in FIG. 1, the programming voltage must perform two tasks. It must convert the semiconductor material of diode 302 from a high-resistivity to a low-resistivity state, and must also cause the dielectric material of dielectric rupture antifuse 118 to undergo dielectric breakdown, during which at least one conductive path is permanently formed through dielectric rupture antifuse 118.

Figure 2:
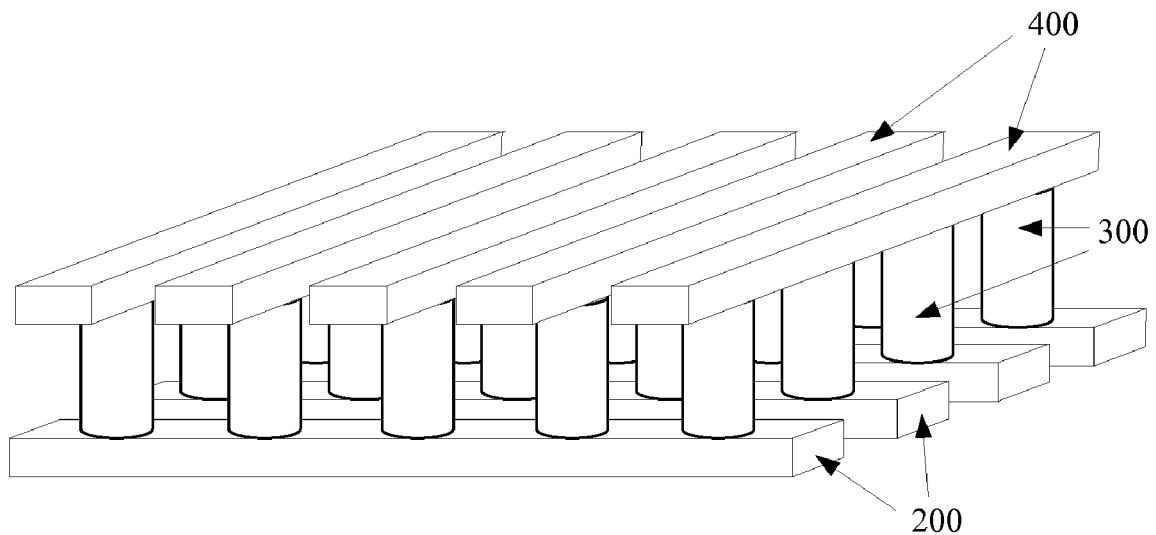
FIG. 2 is a perspective view of a memory level comprising memory cells.

FIG. 2 shows a portion of a first memory level of cells like those of FIG. 1 arranged in a cross-point array comprising a plurality of memory cells. Each memory cell comprises a pillar 300 (which comprises the diode 302 and antifuse 118 shown in FIG. 1), disposed between one of top conductors 400 and one of bottom conductors 200. Top conductors 400 are above bottom conductors 200 and extend in a different direction, preferably perpendicular to them. Two, three, or more such memory levels can be vertically stacked atop one another, forming a monolithic three dimensional memory array.

Figure 3:
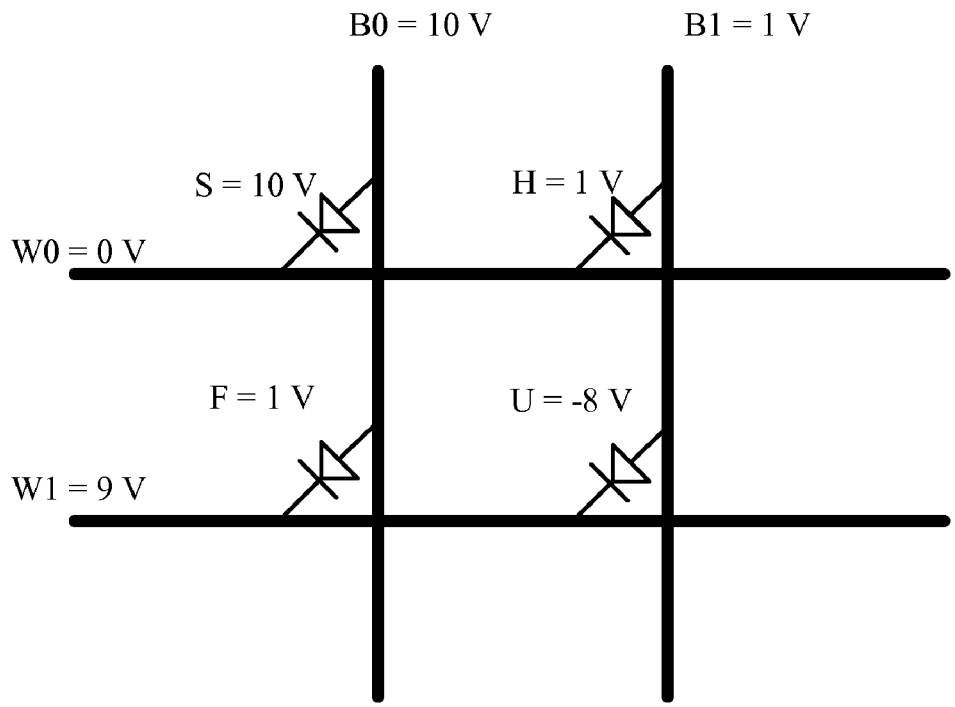
FIG. 3 is a circuit diagram showing a biasing scheme for programming selected cell S while avoiding inadvertent programming of half-selected cells H and F and unselected cell U in a cross-point array.

FIG. 3 illustrates a biasing scheme that may be used to program a memory cell in a cross-point memory array like that shown in FIG. 2. Suppose selected cell S is to be subjected to a programming voltage of 10 volts (the voltages supplied here are examples only). Selected bitline B0 is set at 10 volts and selected wordline W0 at 0 volts, placing 10 volts across selected cell S. To avoid inadvertent programming of cell F, which shares bitline B0 with selected cell S, unselected wordline W1 is set to 9 volts; thus cell F is subjected to only 1 volt, which is below the turn-on voltage for the diode. Similarly, unselected bitline B1 is set to 1 volt; thus cell H, which shares wordline W0 with selected cell S, is subjected to only 1 volt. Unselected cell U, which shares neither wordline nor bitline with selected cell S, is subjected to −8 volts. Note that in this simplified figure, only one unselected bitline B1 and only one unselected wordline W1 are shown. In reality there will be many unselected wordlines and bitlines. An array with N bitlines and M wordlines will include N−1 F cells, M−1 H cells, and a very large number (N−1)*(M−1) of U cells.

The diode in each of the U cells is under reverse bias at a voltage below the diode's breakdown voltage, minimizing the current that flows through this cell. (A diode conducts current asymmetrically, conducting current more readily in one direction than in the other.) There will inevitably be some reverse leakage current, however, and due to the large number of U cells, the reverse leakage current during programming of the selected cell may waste significant power. During programming of the selected cell S, the forward current on H cells and F cells that have been programmed, though small, similarly wastes power. High programming voltage itself is often difficult to generate. For all of these reasons, it is desirable to minimize the magnitude of the electrical pulse required to program the selected memory cell in such a crosspoint memory array.

Feature size is the smallest feature that can be formed by a photolithographic process. Note that for horizontally oriented devices such as transistors, as feature size decreases, in general voltages required to operate the device also decrease. In the memory cell of FIG. 1, however, because of the vertical orientation of the memory cell, in general the magnitude of electrical pulse required to transform the semiconductor material of the diode and to rupture the antifuse does not decrease with features size.

In the '510 application, a dielectric rupture antifuse is paired with a semiconductor diode formed of semiconductor material, for example silicon, where the semiconductor material of the diode is in a low-resistivity state as formed, and need not be converted.

The diode of the '030 patent and the '549 application is formed by depositing a semiconductor material such as silicon in an amorphous state, then performing a thermal anneal to crystallize the silicon, forming a polycrystalline silicon or polysilicon diode. As described in the '530 application, when deposited amorphous silicon is crystallized in contact solely with materials with which it has a high lattice mismatch, such as silicon dioxide and titanium nitride, the polysilicon forms with a high number of crystalline defects, causing it to be high-resistivity. Application of a programming pulse through this high-defect polysilicon apparently alters the polysilicon, causing it to be lower-resistivity.

It has been found, however, that when deposited amorphous silicon is crystallized in contact with a layer of an appropriate silicide, for example titanium silicide or cobalt silicide, the resulting crystallized silicon is much higher quality, with fewer defects, and has much lower resistivity. The lattice spacing of titanium silicide or cobalt silicide is very close to that of silicon, and it is believed that when amorphous silicon is crystallized in contact with a layer of an appropriate silicide at a favorable orientation, the silicide provides a template for crystal growth of silicon, minimizing formation of defects. Unlike the high-defect silicon crystallized adjacent only to materials with which it has a high lattice mismatch, application of a large electrical pulse does not appreciably change the resistivity of this low-defect, low-resistivity silicon crystallized in contact with the silicide layer.

By pairing a dielectric rupture antifuse with such a low-defect, low-resistivity diode, a memory cell can be formed in which the programming pulse need only be sufficient to rupture the dielectric rupture antifuse; the diode is formed of semiconductor material which in its initial state is already low-resistivity and does not need to undergo a high-resistivity-to-low-resistivity conversion.

In embodiments of the '510 application, the low-defect diode is paired with a dielectric rupture antifuse formed of a conventional dielectric material, silicon dioxide. The dielectric rupture antifuse in such a device must be thick enough to be reliably insulating, requiring a relatively large programming voltage. This programming voltage can be reduced by reducing the thickness of the silicon dioxide antifuse. As the silicon dioxide antifuse gets thinner, however, it becomes more vulnerable to defects, which will allow for unwanted leakage current.

The silicon dioxide layer which serves as an antifuse is generally thermally grown. The quality of the antifuse can be improved, and defects decreased, by growing the antifuse at a higher temperature, for example 1000 degrees C. High temperature has other disadvantages, however, causing unwanted diffusion of dopants in diodes and in CMOS control circuits formed beneath the memory levels, damaging and potentially ruining those devices.

A material has a characteristic dielectric constant k. The dielectric constant of a material describes its behavior as an insulator. A good insulator such as conventionally formed silicon dioxide has a low dielectric constant of 3.9. A vacuum, by definition, has the lowest possible dielectric constant of 1. A range of materials, including, for example, $HfO_2$ and $Al_2O_3$, are considered dielectrics, yet have dielectric constants higher than that of silicon dioxide.

A layer of a higher-k material, such as $HfO_2$ or $Al_2O_3$, serving as a dielectric rupture antifuse can be thicker than a layer of a lower-k material such as silicon dioxide of comparable quality while having the same electrical behavior.

McPherson et al., in "Proposed universal relationship between dielectric breakdown and dielectric constant," Proceedings of 2002 IEDM, pp. 633-636, demonstrate that materials having higher dielectric constant k undergo dielectric breakdown at lower electric fields than lower dielectric constant materials. For reasons described earlier, it is desirable to reduce programming voltage in a memory array. In the present invention, a diode formed of low-defect deposited semiconductor material crystallized adjacent to a silicide is paired with a dielectric rupture antifuse formed of a high-k material, having a dielectric constant k greater than about 8. The term "deposited semiconductor material" refers to semiconductor materials such as silicon, germanium, or silicon-germanium alloys that have been deposited, and excludes the monocrystalline wafer substrate above which the device may be built. The voltage required to program the cell is only that required to rupture the antifuse by subjecting it to dielectric breakdown. Forming the antifuse of a high-k material serves to reduce programming voltage while maintaining a highly reliable antifuse before programming with low leakage current after programming.

Note that high-k dielectric materials have been investigated for use in gate oxides of transistors because they can be made thicker than gate oxides of, say, silicon dioxide while having the same or better capacitance. These gate oxides serve a different role in the transistor, however, than the antifuse described here. These gate oxides are not intended, at any point in the life of the device, to suffer dielectric breakdown.

In preferred embodiments, atomic layer deposition (ALD) is used to form the dielectric rupture antifuse of a high-k material. Recent advances in ALD techniques have allowed an extremely high-quality layer of high-k material to be formed which is very thin, for example 50, 30, 20, or 10 angstroms, or less. This very thin layer is of such high quality that leakage current is acceptably low, and such a thin layer requires lower voltage to break down.

McPherson et al. describe that higher-k dielectrics have the additional advantage that they tend to exhibit more uniform breakdown behavior than lower-k dielectrics such as silicon dioxide. When the dielectric rupture antifuses of a memory array rupture across a wide range of programming voltages, the programming voltage must be high enough to rupture antifuses at the high end of the distribution, even though a lower voltage will suffice for most memory cells in the array. A tighter distribution allows further decrease in programming voltage.

Many high-k dielectrics can be formed at relatively low temperature by various deposition processes, including ALD. As a general rule, reducing processing temperature is always advantageous in fabrication of a complex semiconductor device, minimizing dopant diffusion, peeling, etc.

Figure 4:
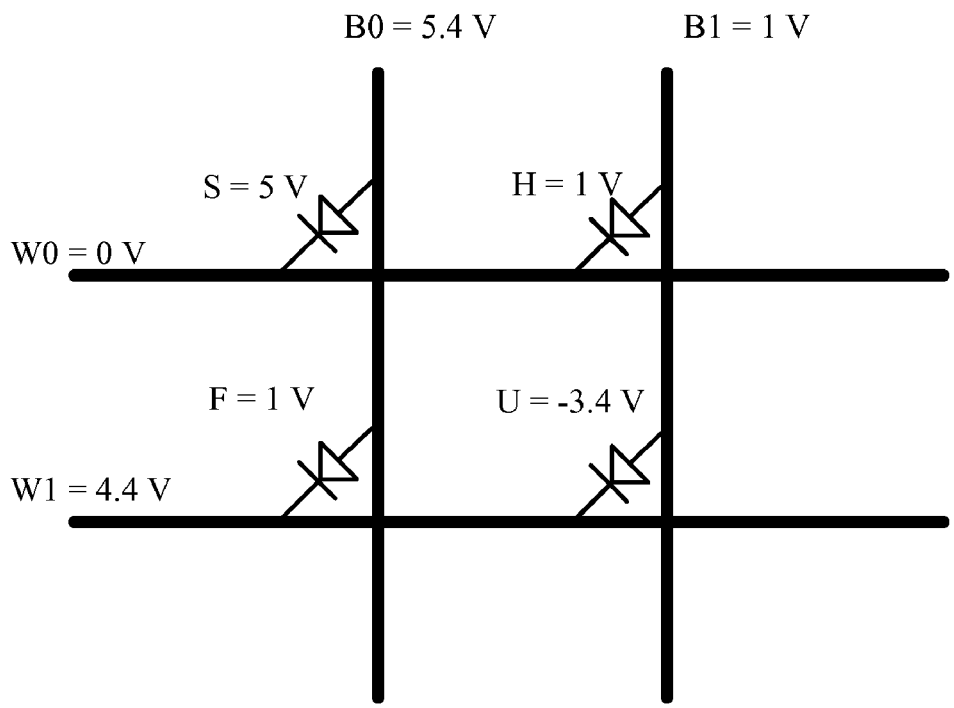
FIG. 4 is a circuit diagram showing voltages across the selected cell S, half-selected cells H and F, and unselected cell U at reduced programming voltage in a cross-point array.

A diode conducts current asymmetrically, conducting more readily under forward bias than under reverse bias. Reverse leakage current, the current that flows under reverse bias, is undesirable. Reverse leakage current reduces superlinearly with reduced negative voltage across the diode. For example, in a diode having a feature size of 0.15 microns formed of low-resistivity semiconductor material as in the present invention, when the diode was under −7 volts, the reverse leakage current was −7.5×10$^{-11}$ amps. When voltage was −5.5 volts, the reverse leakage current was substantially reduced to −3.0×10$^{-11}$ amps. Under voltage of −4.5 volts, reverse leakage current was reduced to 1.6×10$^{-11}$ amps. In the cross-point array pictured in FIG. 2, recall that lower voltage required to program the selected cell S results in lower negative voltage across unselected cells U. For example, turning to FIG. 4, suppose the programming voltage on selected cell S need be only 5.4 volts. The voltage on selected bitline B0 is 5 volts, selected wordline W0 is at 0 volts, for 5.4 volts across selected cell S. If unselected bitline B1 is set to 1 volt and unselected wordline W1 is set to 4.4 volts, cells H and F are both subjected to 1 volt. Unselected cell U is subjected −3.4 volts, significantly lower than −8 volts as in the example of FIG. 3.

In the monolithic memory arrays so far described, silicon has generally been preferred to form the diode. Germanium has a smaller band gap than silicon, and it has been found that a diode formed of an alloy of silicon and germanium has higher reverse leakage current than a pure silicon diode. The leakage current increases with the fraction of germanium. In a cross-point memory array, with unselected cells U at only −3.4 volts, the leakage current will be substantially less, mitigating this disadvantage. As described in Hemer et al., U.S. patent application Ser. No. 11/125,606, "High-Density Nonvolatile Memory Array Fabricated at Low Temperature Comprising Semiconductor Diodes," filed May 9, 2005, owned by the assignee of the present invention and hereby incorporated by reference and hereinafter the '606 application, the temperature required to deposit and crystallize silicon by conventional methods are generally incompatible with aluminum and copper metallization, which cannot tolerate high temperature. As described in this application, use of silicon-germanium diodes with sufficiently high germanium content lowers overall fabrication temperature, allowing use of these low-resistivity metals, improving device performance.

Figure 5:
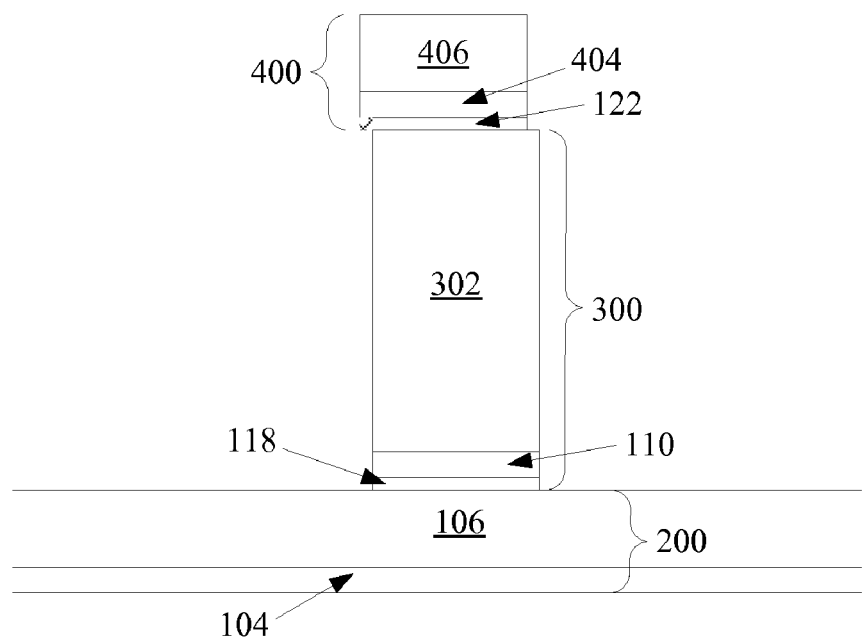
FIG. 5 is a cross-sectional view of a memory cell formed according to a preferred embodiment of the present invention.

FIG. 5 shows a memory cell formed according to a preferred embodiment of the present invention. Bottom conductor 200 includes adhesion layer 104, preferably of titanium nitride, and conductive layer 106, preferably of tungsten. A dielectric rupture antifuse 118 formed of a high-k dielectric material is formed above bottom conductor 200. A barrier layer 110, for example of titanium nitride, intervenes between dielectric rupture antifuse 118 and vertically oriented contiguous p-i-n diode 302. Layer 110 may be omitted in some embodiments. Pillar 300 includes barrier layer 110 and diode 302. Silicide layer 122, which is preferably cobalt silicide or titanium silicide, is part of top conductor 400, which further includes conductive layers such as, for example, titanium nitride layer 404 and tungsten layer 406. (As will be seen, silicide is only formed where a silicide-forming metal is in contact with the silicon of diode 302; the cross-hatched portion of layer 122 is unreacted metal, not silicide.) Top conductor 400, which is shown slightly misaligned with underlying pillar 300, is preferably rail-shaped, shown in cross-section extending out of the page. Preferred materials for use in antifuse 118 include HfO$_2$, Al$_2$O$_3$, ZrO$_2$, TiO$_2$, La$_2$O$_3$, Ta$_2$O$_5$, RuO$_2$, ZrSiO$_x$, AlSiO$_x$, HfSiO$_x$, HfAlO$_x$, HfSiON, ZrSiAlO$_x$, HfSiAlO$_x$, HfSiAlON, and ZrSiAlON. The silicon of diode 302 is preferably deposited amorphous, then crystallized. In some embodiments, it may be preferred to crystallize diode 302, then strip silicide 122 so it is not present in the finished device. Additional layers which are not shown may be present, such as barrier layers and adhesion layers; alternatively, some barrier layers which are included may be omitted in some embodiments.

Figure 6:
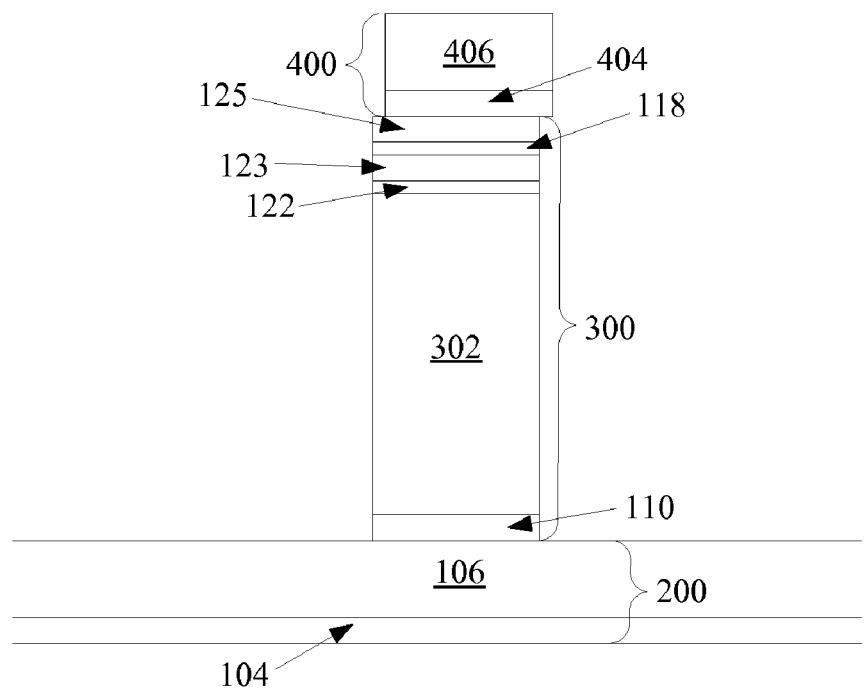
FIG. 6 is a cross-sectional view of a memory cell formed according to an alternative embodiment of the present invention.

FIG. 6 shows an alternative embodiment. Bottom conductor 200 is formed as in the embodiment of FIG. 5. Pillar 300 includes barrier layer 110 (preferably titanium nitride), contiguous p-i-n diode 302, silicide layer 122, conductive barrier layer 123, dielectric rupture antifuse 118 formed of a high-k dielectric material, and conductive barrier layer 125. Top conductor 400 includes conductive adhesion layer 404, preferably of titanium nitride, and conductive layer 406, for example of tungsten.

Figure 7:
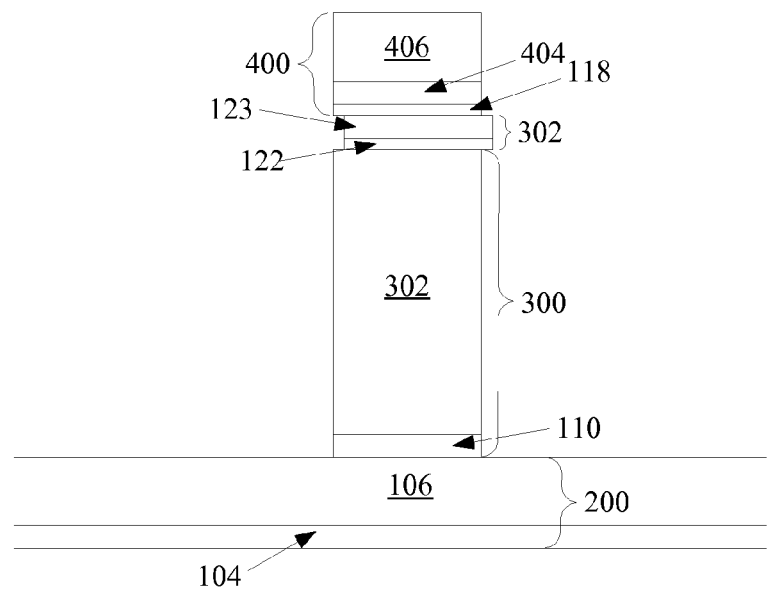
FIG. 7 is a cross-sectional view of a memory cell formed according to another alternative embodiment of the present invention.

FIG. 7 shows another alternative embodiment. Bottom conductor 200 is formed as in the embodiments of FIGS. 5 and 6. Pillar 300 includes barrier layer 110 (preferably titanium nitride) and contiguous p-i-n diode 302. Short pillar 304, etched in a different etch step from pillar 300, includes silicide layer 122 and conductive barrier layer 123. Top conductor 400 includes conductive adhesion layer 402, preferably of titanium nitride, and conductive layer 406, for example of tungsten. Dielectric rupture antifuse 118 formed of a high-k dielectric material intervenes between top conductor 400 and conductive barrier layer 123. It can be a continuous blanket, or can be patterned with top conductor 400, as shown. Many other alternative embodiments can be imagined which similarly include a contiguous p-i-n diode and a high-k dielectric rupture antifuse.

Each of these embodiments is a semiconductor device comprising: a contiguous p-i-n diode formed of deposited semiconductor material, wherein the semiconductor material was crystallized adjacent to a silicide, germanide, or silicide-germanide germanide layer; and a dielectric rupture antifuse arranged electrically in series with the diode, the dielectric rupture antifuse comprising a dielectric material having a dielectric constant greater than 8. In each embodiment, the vertically oriented diode is disposed between a bottom conductor and a top conductor, the dielectric rupture antifuse is disposed between the diode and the top conductor or between the diode and the bottom conductor. In these examples, neither the top nor the bottom conductor comprises a silicon layer.

The term "contiguous p-i-n diode" describes a diode formed of semiconductor material which has heavily doped p-type semiconductor material at one end and heavily doped n-type semiconductor material at the other, with intrinsic or lightly doped semiconductor material between, with no dielectric rupture antifuse sufficient to prevent most current flow before it is ruptured intervening between the p-type region and the n-type region. A p-i-n diode is preferred for use in a large memory array because such a diode minimizes leakage current under reverse bias.

In any of these cells, before programming, the antifuse 118 is intact and impedes current flow. During programming, when a programming voltage is supplied between top conductor 400 and bottom conductor 200, a portion of the dielectric rupture antifuse suffers dielectric breakdown, forming a conductive path through the dielectric rupture antifuse 118 between the contiguous p-i-n diode 302 and the top conductor 400 or between the contiguous p-i-n diode 302 and the bottom conductor 200.

In embodiments of the present invention it may be preferred for the dielectric rupture antifuse formed of a high-k dielectric material to be disposed between two metal or metallic layers such as titanium nitride or a conductive metal silicide. These conductive layers help build capacitance across the antifuse, allowing it to rupture more readily than if the antifuse is disposed between semiconductor layers or between a semiconductor layer and a metal or metallic layer.

A detailed example will be provided of formation of a monolithic three dimensional memory array formed according to a preferred embodiment of the present invention. For completeness, specific process conditions, dimensions, methods, and materials will be provided. It will be understood, however, that such details are not intended to be limiting, and that many of these details can be modified, omitted or augmented while the results still fall within the scope of the invention. For example, some details from the '030 patent, the '549, '530, and '510 applications may be useful. To avoid obscuring the invention, all details from this patent and these applications have not been included, but it will be understood that no relevant teaching is intended to be excluded.

EXAMPLE

Figure 8A:
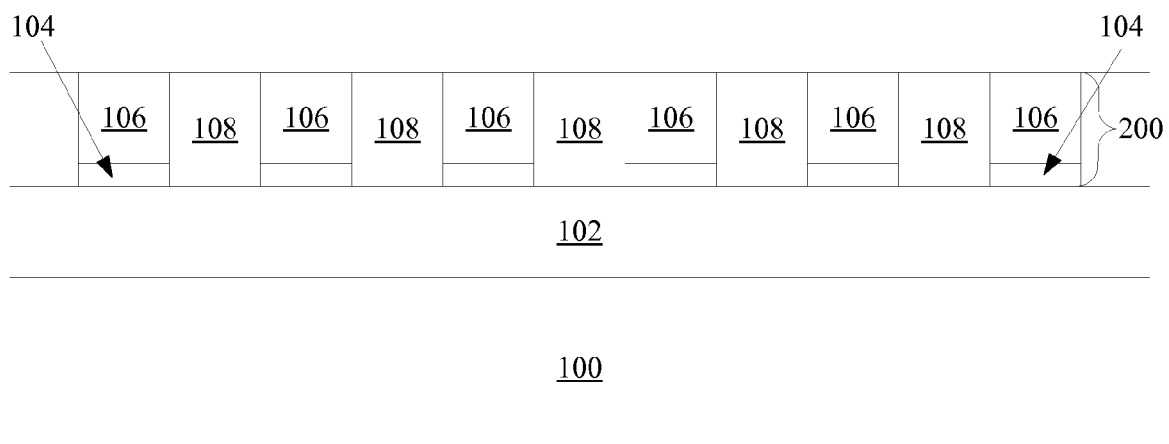
FIGS. 8a-8c are cross-sectional views showing stages in formation of a first memory level of a monolithic three dimensional memory array formed according to a preferred embodiment of the present invention.

Turning to FIG. 8a, formation of the memory begins with a substrate 100. This substrate 100 can be any semiconducting substrate known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, Si—C—O—H film, or any other suitable insulating material.

The first conductors 200 are formed over the substrate 100 and insulator 102. An adhesion layer 104 may be included between the insulating layer 102 and the conducting layer 106 to help conducting layer 106 adhere to insulating layer 102. If the overlying conducting layer 106 is tungsten, titanium nitride is preferred as adhesion layer 104. Conducting layer 106 can comprise any conducting material known in the art, such as tungsten, or other materials, including tantalum, titanium, copper, cobalt, or alloys thereof.

Once all the layers that will form the conductor rails have been deposited, the layers will be patterned and etched using any suitable masking and etching process to form substantially parallel, substantially coplanar conductors 200, shown in FIG. 8a in cross-section. Conductors 200 extend out of the page. In one embodiment, photoresist is deposited, patterned by photolithography and the layers etched, and then the photoresist removed using standard process techniques.

Next a dielectric material 108 is deposited over and between conductor rails 200. Dielectric material 108 can be any known electrically insulating material, such as silicon oxide, silicon nitride, or silicon oxynitride. In a preferred embodiment, silicon dioxide deposited by a high-density plasma method is used as dielectric material 108.

Finally, excess dielectric material 108 on top of conductor rails 200 is removed, exposing the tops of conductor rails 200 separated by dielectric material 108, and leaving a substantially planar surface. The resulting structure is shown in FIG. 8a. This removal of dielectric overfill to form the planar surface can be performed by any process known in the art, such as chemical mechanical planarization (CMP) or etchback. In an alternative embodiment, conductors 200 could be formed by a Damascene method instead.

Figure 8B:
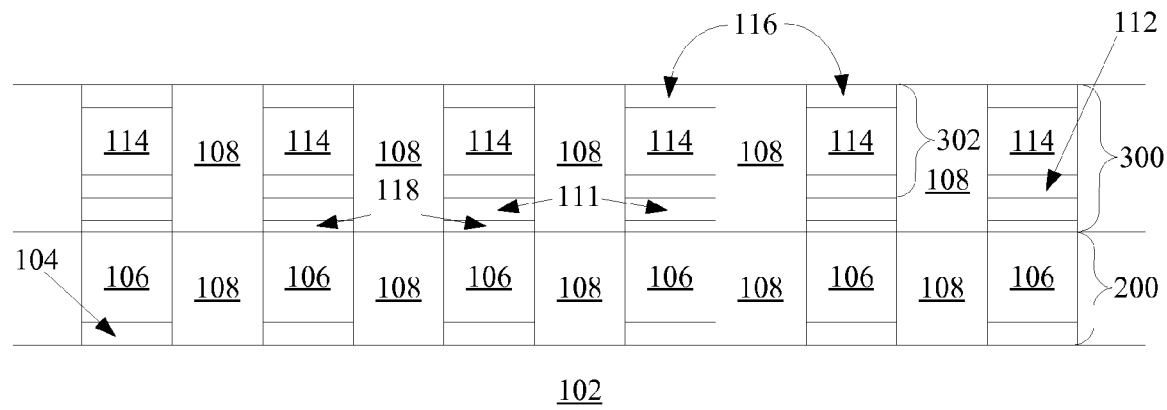

Turning to FIG. 8b, next a thin layer 118 of a high-k dielectric material, having a dielectric constant k greater than about 8, is formed. (For simplicity substrate 100 is omitted from FIG. 8b and succeeding figures; its presence will be assumed.) The value of dielectric constant k for this material is preferably between 8 and 50, most preferably between about 8 and about 25. This layer is preferably between about 10 and about 200 angstroms, for example between about 20 and about 100 angstroms. Preferred materials for layer 118 include $HfO_2$, $Al_2O_3$, $ZrO_2$, $TiO_2$, $La_2O_3$, $Ta_2O_5$, $RuO_2$, $ZrSiO_x$, $AlSiO_x$, $HfSiO_x$, $HfAlO_x$, $HfSiON$, $ZrSiAlO_x$, $HfSiAlO_x$, $HfSiAlON$, and $ZrSiAlON$. In some embodiments two or more of these materials may be blended. Most preferred materials include $HfO_2$, which has a dielectric constant of about 25, or $Al_2O_3$, which has a dielectric constant of about 9. In preferred embodiments, layer 118 is formed by ALD, forming a very high-quality film. A high-quality film is preferably dense, as close to its theoretical density as possible; has complete coverage with few or no pinholes; and has a low density of electrical defects. In general it will be preferred for materials of comparable film quality having a higher dielectric constant to be thicker than those with a lower dielectric constant. For example, a film of $Al_2O_3$ formed by ALD preferably has a thickness between about 5 and about 80 angstroms, preferably about 30 angstroms, while a film of $HfO_2$ formed by ALD preferably has a thickness between about 5 and about 100 angstroms, preferably about 40 angstroms. Layer 118 will serve as a dielectric rupture antifuse. In some embodiments, it may be preferred to deposit a conductive barrier layer (not shown) before depositing layer 118. This barrier layer, for example of about 100 angstroms of titanium nitride, will provide a uniform surface on which to deposit high-k dielectric rupture antifuse layer 118, which may improve the uniformity of that layer.

Barrier layer 111 is deposited on layer 118. It can be any appropriate conductive barrier material, for example titanium nitride, with any appropriate thickness, for example 50 to 200 angstroms, preferably 100 angstroms. In some embodiments barrier layer 111 may be omitted.

Next semiconductor material that will be patterned into pillars is deposited. The semiconductor material can be silicon, germanium, a silicon-germanium alloy, or other suitable semiconductors, or semiconductor alloy. For simplicity, this description will refer to the semiconductor material as silicon, but it will be understood that the skilled practitioner may select any of these other suitable materials instead.

Bottom heavily doped region 112 can be formed by any deposition and doping method known in the art. The silicon can be deposited and then doped, but is preferably doped in situ by flowing a donor gas providing n-type dopant atoms, for example phosphorus, during deposition of the silicon. Heavily doped region 112 is preferably between about 100 and about 800 angstroms thick.

Intrinsic region 114 can be formed by any method known in the art. Region 114 can be silicon, germanium, or any alloy of silicon or germanium and has a thickness between about 1100 and about 3300 angstroms, preferably about 2000 angstroms. The silicon of heavily doped region 112 and intrinsic region 114 is preferably amorphous as deposited.

Semiconductor regions 114 and 112 just deposited, along with underlying barrier layer 111, high-k dielectric layer 118, and barrier layer 110, will be patterned and etched to form pillars 300. Pillars 300 should have about the same pitch and about the same width as conductors 200 below, such that each pillar 300 is formed on top of a conductor 200. Some misalignment can be tolerated.

Pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728,436, "Photomask Features with Interior Nonprinting Window Using Alternating Phase Shifting," filed Dec. 5, 2003, issued Feb. 6, 2007, as U.S. Pat. No. 7,172,840; or Chen, U.S. application Ser. No. 10/815,312, "Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of pillars 300 is removed, exposing the tops of pillars 300 separated by dielectric material 108, and leaving a substantially planar surface. This removal of dielectric overfill can be performed by any process known in the art, such as CMP or etchback. After CMP or etchback, ion implantation is performed, forming heavily doped p-type top regions 1 16. The p-type dopant is preferably a shallow implant of boron, with an implant energy of, for example, 2 keV, and dose of about $3\times10^{15}/cm^2$. This implant step completes formation of diodes 302. The resulting structure is shown in FIG. 8b. In the diodes just formed, bottom heavily doped regions 112 are n-type while top heavily doped regions 116 are p-type; clearly the polarity of the diodes could be reversed.

Summarizing, the pillars 300 are formed by depositing a semiconductor layerstack above the first conductors 200; patterning and etching the semiconductor layerstack in the form of pillars 300 in a single patterning step. After completion of the device, the contiguous p-i-n diode is disposed within the pillar.

Figure 8C:
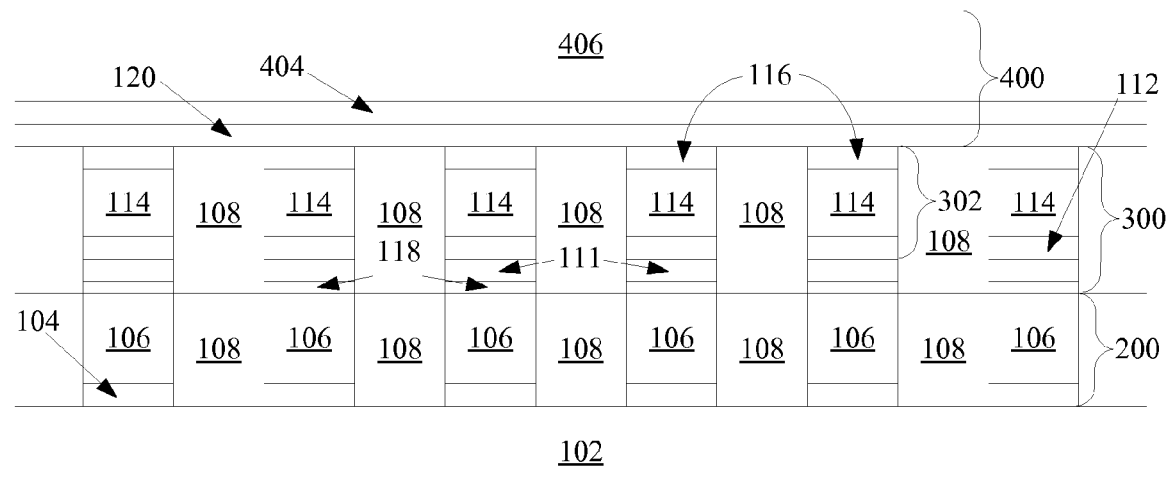

Turning to FIG. 8c, after cleaning any native oxide that has formed on tops of pillars 300, a layer 120 of a silicide-forming metal, for example titanium, cobalt, chromium, tantalum, platinum, nickel, niobium, or palladium, is deposited. Layer 120 is preferably titanium or cobalt; if layer 120 is titanium, its thickness is preferably between about 10 and about 100 angstroms, most preferably about 20 angstroms. Layer 120 is followed by titanium nitride layer 404. Both layers 120 and 404 are preferably between about 20 and about 100 angstroms, most preferably about 50 angstroms. Next a layer 406 of a conductive material, for example tungsten, is deposited. Layers 406, 404, and 120 are patterned and etched into rail-shaped top conductors 400, which preferably extend in a direction perpendicular to bottom conductors 200.

Next a dielectric material (not shown) is deposited over and between conductors 400. The dielectric material can be any known electrically insulating material, such as silicon oxide, silicon nitride, or silicon oxynitride. In a preferred embodiment, silicon oxide is used as this dielectric material.

Formation of a first memory level has been described. Additional memory levels can be formed above this first memory level to form a monolithic three dimensional memory array. The array just described is just one example; and may vary in other ways, for example including either of the memory cells shown in FIGS. 6 and 7.

Referring to FIG. 10c, note that layer 120 of a silicide-forming metal is in contact with the silicon of top heavily doped region 116. During subsequent elevated temperature steps, the metal of layer 120 will react with some portion of the silicon of heavily doped region 116 to form a silicide layer (not shown). This silicide layer forms at a temperature lower than the temperature required to crystallize silicon, and thus will form while regions 112, 114, and 116 are still largely amorphous. If a silicon-germanium alloy is used for top heavily doped region 116, a silicide-germanide layer may form, for example of cobalt silicide-germanide or titanium silicide-germanide.

Preferably after all of the memory levels have been formed, a single crystallizing anneal is performed to crystallize diodes 302, for example at 750 degrees C. for about 60 seconds, though each memory level can be annealed as it is formed. The resulting diodes will generally be polycrystalline. Since the semiconductor material of these diodes is crystallized in contact with a silicide or silicide-germanide layer with which it has a good lattice match, the semiconductor material of diodes 302 will be low-defect and low-resistivity.

If $HfO_2$ was used for dielectric rupture antifuse 118, care should be taken to keep processing temperatures below the crystallization temperature of $HfO_2$, which may be about 700 to about 800 degrees C. An intact antifuse layer of crystalline $HfO_2$ has much higher leakage than a layer of amorphous $HfO_2$.

In some embodiments, conductors can be shared between memory levels; i.e. top conductor 400 would serve as the bottom conductor of the next memory level above. In other embodiments, an interlevel dielectric (not shown) is formed above the first memory level of FIG. 8c, its surface planarized, and construction of a second memory level begins on this planarized interlevel dielectric, with no shared conductors.

The present invention allows for a reduction in programming voltage. In embodiments of the '030 patent, a programming voltage sufficient to program more nearly all (more than 99 percent, for example) of the cells in an array includes a pulse across the cell to be programmed of at least 8 volts. In embodiments of the present invention, like the array just described, programming voltage can be reduced. For example, nearly all of the cells in an array can be programmed with a programming pulse less than about 8 volts, and in some embodiments less than 6 volts, or less than 4.0 volts.

In some embodiments, it may be preferred for the programming pulse to be applied with the diode in reverse bias. This may have advantages in reducing or eliminating leakage across the unselected cells in the array, as described in Kumar et al., U.S. patent application Ser. No. 11/496,986, "Method For Using A Memory Cell Comprising Switchable Semiconductor Memory Element With Trimmable Resistance," filed Jul. 28, 2006, owned by the assignee of the present invention and hereby incorporated by reference.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

An alternative method for forming a similar array in which conductors are formed using Damascene construction is described in Radigan et al., U.S. patent application Ser. No. 11/444,936, "Conductive Hard Mask to Protect Patterned Features During Trench Etch," filed May 31, 2006, assigned to the assignee of the present invention and hereby incorporated by reference. The methods of Radigan et al. may be used instead to form an array according to the present invention.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for forming and programming a nonvolatile memory cell, the method comprising:
    forming a contiguous p-i-n diode, the contiguous p-i-n diode comprising deposited semiconductor material;
    forming a layer of a silicide, silicide-germanide, or germanide in contact with the deposited semiconductor material;
    crystallizing the deposited semiconductor material in contact with the layer of silicide, silicide-germanide, or germanide;
    forming a layer of a dielectric material having a dielectric constant greater than 8; and
    subjecting a portion of the layer of dielectric material to dielectric breakdown,
    wherein the memory cell comprises the contiguous p-i-n diode and the layer of dielectric material.

2. The method of claim 1 wherein the layer of dielectric material is deposited by atomic layer deposition.

3. The method of claim 1 wherein the layer of dielectric material is 50 angstroms thick or less.

4. The method of claim 3 wherein the layer of dielectric material is 25 angstroms thick or less.

5. The method of claim 1 wherein the dielectric material is selected from the group consisting of $TiO_2$, and $Ta_2O_5$.

6. The method of claim 1, wherein the dielectric material is selected from the group consisting of $La_2O_3$, $RuO_2$, $ZrSiO_x$, $AlSiO_x$, $HfSiO_x$, $HfAlO_x$, $HfSiON$, $ZrSiAlO_x$, $HfSiAlO_x$, $HfSiAlON$, and $ZrSiAlON$.

7. The method of claim 1 wherein the deposited semiconductor material comprises silicon, germanium, or a silicon-germanium alloy.

8. The method of claim 1 wherein the silicide, silicide-germanide, or germanide is a) titanium silicide, titanium silicide-germanide, or titanium germanide, or b) cobalt silicide, cobalt silicide-germanide, or cobalt germanide.

9. The method of claim 1 wherein the contiguous p-i-n diode is disposed between a first conductor and a second conductor, and wherein the layer of dielectric material is disposed either a) between the contiguous p-i-n diode and the first conductor or b) between the contiguous p-i-n diode and the second conductor.

10. The method of claim 9 wherein the step of subjecting the portion of the dielectric layer to dielectric breakdown is achieved by applying a programming voltage between the first conductor and the second conductor.

11. The method of claim 10 wherein the programming voltage does not exceed about 8 volts.

12. The method of claim 9 wherein the contiguous p-i-n diode is vertically oriented, and is vertically disposed between the first conductor and between the second conductor, and wherein the second conductor is above the first conductor.

13. The method of claim 12 wherein the step of forming the contiguous p-i-n diode comprises:
    forming the first conductor;
    after the step of forming the first conductor, depositing a semiconductor layerstack above the first conductor;
    patterning and etching the semiconductor layerstack in the form of a pillar in a single patterning step; and
    after the step of patterning and etching the semiconductor layerstack, forming the second conductor above the pillar,
    wherein, after completion of the device, the contiguous p-i-n diode is disposed within the pillar.

14. The method of claim 1 wherein the memory cell is programmed during the step of subjecting the portion of the layer of dielectric material to dielectric breakdown.

15. The method of claim 1 wherein the semiconductor material is polycrystalline.

* * * * *